(12) United States Patent
Li et al.

(10) Patent No.: US 10,509,436 B2
(45) Date of Patent: Dec. 17, 2019

(54) DISPLAY PANEL AND DISPLAY DEVICE

(71) Applicant: Wuhan China Star Optoelectronics Semiconductor Display Technology Co., Ltd., Wuhan, Hubei (CN)

(72) Inventors: Guang Li, Guangdong (CN); Jun Chen, Guangdong (CN); Shou-Cheng Wang, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/748,948

(22) PCT Filed: Dec. 21, 2017

(86) PCT No.: PCT/CN2017/117738
§ 371 (c)(1),
(2) Date: Oct. 26, 2018

(87) PCT Pub. No.: WO2019/090922
PCT Pub. Date: May 16, 2019

(65) Prior Publication Data
US 2019/0146548 A1 May 16, 2019

(30) Foreign Application Priority Data
Nov. 10, 2017 (CN) .......................... 2017 1 1104124

(51) Int. Cl.
*G06F 1/16* (2006.01)
*H05B 33/04* (2006.01)
(Continued)

(52) U.S. Cl.
CPC .......... *G06F 1/1601* (2013.01); *G06F 1/1637* (2013.01); *G06F 1/1652* (2013.01);
(Continued)

(58) Field of Classification Search
CPC ....... G06F 1/1601; H05B 33/04; H01L 51/52; H01L 27/3276; H01L 51/5237
See application file for complete search history.

(56) References Cited

U.S. PATENT DOCUMENTS 4,468,659 A * 8/1984 Ohba ....................... G09G 3/30
345/206
2014/0321072 A1* 10/2014 Cavallaro .............. H05K 1/028
361/749

(Continued)

FOREIGN PATENT DOCUMENTS

CN 204651320 U * 9/2015
CN 204651320 U 9/2015
(Continued)

OTHER PUBLICATIONS

Office Action dated Feb. 3, 2019 from corresponding application No. CN 201711104124.4.

*Primary Examiner* — Hoa C Nguyen
*Assistant Examiner* — Keith DePew
(74) *Attorney, Agent, or Firm* — Hemisphere Law, PLLC; Zhigang Ma (57) ABSTRACT

A display panel is provided. The display panel includes a display area including four sides and four corners, and all of the corners are not right angles; and a border area surrounding the display area, wherein four fold lines respectively parallel to the four sides are arranged in the border area, the four fold lines enclose a fold frame, the fold frame divides the border area into a first border area and a second border area, the second border area includes four borders and a turning portion connecting every two of the four borders,
(Continued)

and the turning portions makes the four borders be independently folded along the fold frame. The display panel of the disclosure adopts a special display area design and a special border area wiring method to ensure the reliability of the thin film encapsulation and achieve the ultra-narrow border or even borderless border of the flexible display.

10 Claims, 5 Drawing Sheets

(51) Int. Cl.
*H01L 27/32* (2006.01)
*H01L 51/52* (2006.01)

(52) U.S. Cl.
CPC .......... H05B 33/04 (2013.01); *H01L 27/3276* (2013.01); *H01L 51/52* (2013.01); *H01L 51/5237* (2013.01); *H01L 51/5253* (2013.01)

(56) References Cited

U.S. PATENT DOCUMENTS

| 2019/0043418 A1* | 2/2019 | Rieutort-Louis | .... G09G 3/3216 |
| 2019/0206976 A1* | 7/2019 | Jeong | .................. H01L 27/3276 |

FOREIGN PATENT DOCUMENTS

| CN | 104965330 A | 10/2015 |
| CN | 104464540 B | 4/2016 |
| CN | 205176728 U | 4/2016 |
| CN | 205428453 U | 8/2016 |
| CN | 106875840 A | 6/2017 |
| CN | 106887187 A | 6/2017 |
| CN | 107025852 A | 8/2017 |
| GB | 2084778 A | 4/1982 |

* cited by examiner

DISPLAY PANEL AND DISPLAY DEVICE

RELATED APPLICATIONS

The present application is a National Phase of International Application Number PCT/CN2017/117738, filed Dec. 21, 2017, and claims the priority of China Application No. 201711104124.4, filed Nov. 10, 2017.

FIELD OF THE DISCLOSURE

The disclosure relates to a display technical field, and more particularly to a display panel and a display device.

BACKGROUND

Narrow border display has become the main trend of high-quality display because of its simplicity, beauty, large viewing area in the same size and so on. With the rapid development of flat panel display technology, narrow border technology has been put forward higher requirements, flexible display has great advantages in narrow border technology due to its bendability.

The display area is usually directly reducing the width of the wiring area outside the display area to achieve a narrow border in the existing flexible display, or bending two pairs of border area to form a curved surface, or integrating the chip on the film to narrow the border width of the connecting end of the flexible display. However, these methods only reduce the border width of the three sides at most, and the degree of reduction is limited, so the ultra-narrow borders of four sides or even borderless are could not achieved.

SUMMARY

A technical problem to be solved by the disclosure is to provide a display panel to achieve ultra-narrow borders on the display panel, so the proportion of the screen could be increased.

Furthermore, the disclosure further provides a display device.

The display panel provided by the disclosure includes:

A display area, wherein the display area includes four sides and four corners, and all of the four corners are not right angles; and a border area, surrounding the display area, wherein four fold lines respectively parallel to the four sides are arranged in the border area, the four fold lines enclose a fold frame, the fold frame divides the border area into a first border area and a second border area, the second border area includes four borders and a turning portion connecting every two of the four borders, and the turning portions makes the four borders be independently folded along the fold frame.

Wherein, the four corners include round corners, elliptical corners, cone corners, or chamfered corners.

Wherein, the turning portion includes a first edge and a second edge connecting to the first edge, and the first edge and the second edge are straight edges.

Wherein, an end of the first edge and an end of the second edge are perpendicularly connected, or the first edge and the second edge are connected to form a bevel edge, and a connection portion intersects a corner location of the fold frame.

Wherein, the turning portion includes a first edge and a second edge connecting to the first edge, and the first edge and the second edge are curve edges.

Wherein, the first edge and the second edge are connected via a connection edge, the connection edge includes a first segment and a second segment perpendicularly arranged, the first edge and the second edge are connected via the first segment and the second segment.

Wherein, the first edge and the second edge are connected via a connection edge, the connection edge is a curve edge including a first end and a second end, the first edge and the second edge are connected via the first end and the second end.

Wherein, a distance between the fold frame and the display area ranges from 0.05 mm to 1 mm.

Wherein, the four borders are folded along the fold frame in any angle.

The display device provided by the disclosure includes the above-mentioned display panel.

The display panel of the disclosure adopts a special display area design and a special border area wiring method to ensure the reliability of the thin film encapsulation and achieve the ultra-narrow border or even borderless border of the flexible display, so the proportion of the screen could be increased.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts.

DETAILED DESCRIPTION OF PREFERRED EMBODIMENTS

In order to illustrate a technical solution according to embodiments of the disclosure more clearly, drawings to be used in the description of the embodiments will be briefly set forth in the following. It is obvious that the drawings in the following description are only related to some embodiments of the disclosure. Those ordinarily skilled in the art may obtain other embodiments according to these drawings, without any inventive work.

Figure 1:
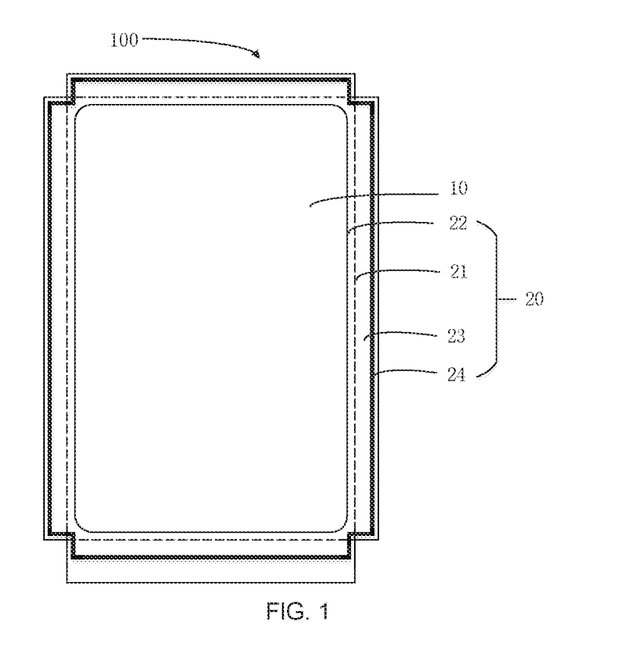
FIG. 1 is a structural schematic view of a display panel according to an embodiment of the disclosure.

Please refer to FIG. 1, a display panel 100 provided by the disclosure, the display panel 100 includes a display side and a back side opposite to the display side. The display panel 100 includes a display area 10 and a border area 20.

The display area 10 includes four sides and four corners, and all of the four corners are not right angles.

The border area 20 surrounds the display area 10, four fold lines respectively parallel to the four sides are arranged in the border area, the four fold lines enclose a fold frame 21, the fold frame 21 is disposed close to the display area 10, a distance between the fold frame 21 and the display area 10 ranges from 0.05 mm to 1 mm. The fold frame 21 divides the border area 20 into a first border area 22 and a second border area 23. The first border area 22 is disposed between the display area 10 and the second border area 23. The second border area 23 includes four borders and a turning portion connecting every two of the four borders, and the turning portions makes the four borders be independently folded along the fold frame 21.

In this embodiment, a thin film encapsulation structure 24 and a circuit structure configured to used in the display area 10 are disposed in the border area 20. The thin film encapsulation structure 24 is disposed in the second border area 23, and the thin film encapsulation structure 24 is a closed encapsulation structure, the thin film encapsulation structure 24 encapsulates the display panel 100 and protects the display panel 100 to prevent water and oxygen from entering the display panel 100. The circuit structure is disposed between the thin film encapsulation structure 24 and the display area 10, the circuit structure includes a data signal circuit structure and a gate driving circuit structure (GOA, Gate on Array).

The disclosure avoids the damage of the thin film encapsulation structure 24 and the circuit structure of the display panel 100 by designing the four borders independently folded along the fold frame 21 when the four borders folding toward the back side of the display panel 100 to achieve the ultra-narrow border or even borderless border, so the proportion of the screen could be increased.

Figure 2:
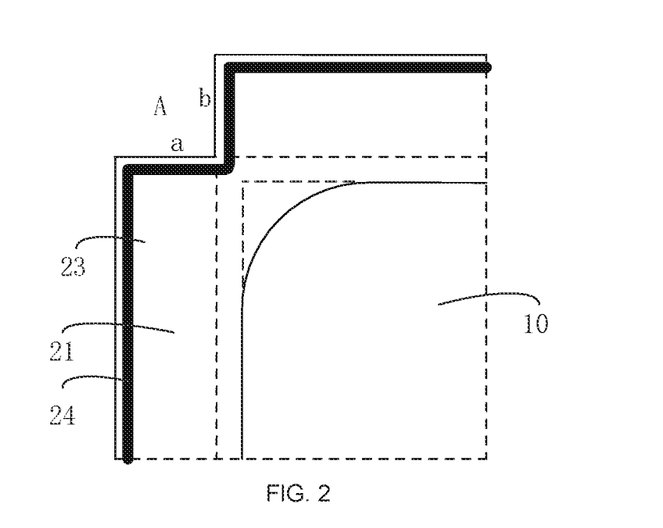
FIG. 2 is an enlarged schematic view of the display panel in FIG. 1.

An enlarged schematic view of a portion of the display panel in FIG. 1 as shown in FIG. 2. In the first embodiment of the display area 10, the four corners of the display area 10 are round corners. As shown in FIG. 2, compare to the four corners of the display area in the conventional display panel are right angles, the four corners of the display area 10 in this embodiment are round corners, so the distance between the boundary of the display area 10 and the boundary of the corner of the display panel 100 is increased. Obviously, as the distance between the boundary of the display area 10 and the boundary of the corner of the display panel 100 increases, the distance between the thin film encapsulation structure 24 and the boundary of the display area 10 also increases to effectively prevent water and oxygen from entering the display area 10 due to the sufficient distance after the thin film encapsulation structure 24 encapsulating the display panel 100. Moreover, as the distance between the boundary of the display area 10 and the boundary of the corner of the display panel 100 increases, the distribution area of the wiring of the circuit structure also increases, so the wiring of the circuit structure is easily arranged in the border area 20.

In this embodiment, the wiring of the data signal circuit structure and the gate driving circuit structure is distributed along the four round corners, so the increased distribution area of the wiring is effectively used.

Figure 3:
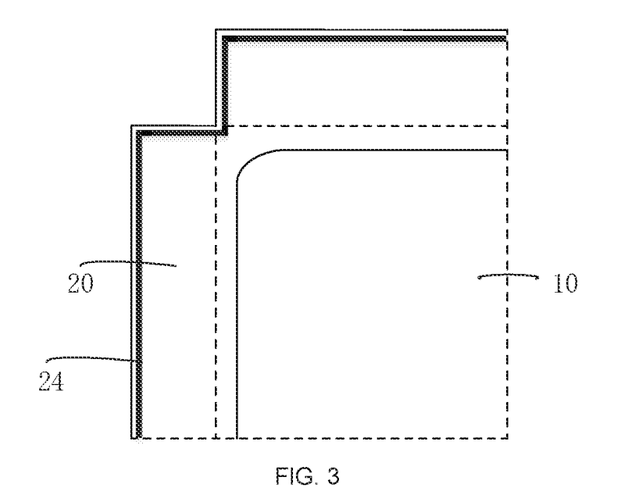
FIG. 3 is a partial enlarged schematic view of the second embodiment of the display area in the display panel in FIG. 1.

Please refer to FIG. 3, the difference between the above-mentioned embodiment is that the four corners of the display area 10 are curves in the second embodiment of the display area 10, and the four corners could be arranged in different types or sizes. The four corners being curves could increase the distance between the boundary of the display area 10 and the boundary of the corner of the display panel 100, so the distance between the thin film encapsulation structure 24 and the boundary of the display area 10 is increased to increase the distribution area of the wiring of the circuit structure and prevent water and oxygen from entering the display area 10 to damage the display panel 100, the reliability of the display panel 100 is increased.

Figure 4:
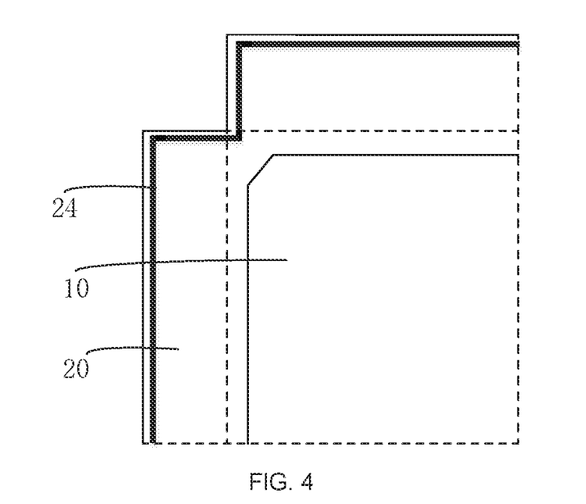
FIG. 4 is a partial enlarged schematic view of the third embodiment of the display area in the display panel in FIG. 1.

Please refer to FIG. 4, the difference between the above-mentioned embodiment is that the four corners of the display area 10 are chamfered corners in the third embodiment of the display area 10, and the four corners could be arranged in different types or sizes. The four corners being chamfered corners could increase the distance between the thin film encapsulation structure 24 and the boundary of the display area 10 and the distribution area of the wiring of the circuit structure to prevent water and oxygen from entering the display area 10 to damage the display panel 100 after folding and encapsulating the display panel 100, so the reliability of the display panel 100 is increased.

In this embodiment, the four corners of the display area 10 could be elliptical corners or cone corners in different types or sizes to increase the distance between the thin film encapsulation structure 24 and the boundary of the display area 10 and the distribution area of the wiring of the circuit structure to prevent water and oxygen from entering the display area 10 to damage the display panel 100, so the ultra-narrow border or even borderless border could be achieved and the reliability of the display panel 100 is increased at the same time.

In this embodiment, the first border area 22 of the border area 20 surrounding the display area 10 is located between the display area 10 and the fold frame 21. The second border area 23 is disposed surrounding the first border area 22. The turning portion of the second border area 23 makes the four borders of the second border area 23 be independently folded along the fold frame respectively, and the folding direction and trace of other borders are not impacted. Specifically, the turning portion of the second border area 23 includes a first edge and a second edge connecting to the first edge. As shown in FIG. 2, the turning portion in the first embodiment, the first edge a and the second edge b of the turning portion A are straight edges, an end of the first edge a and an end of the second edge b are perpendicularly connected, at this time, the connection portion between the first edge a and the second edge b is the apex of the fold frame 21.

Figure 5:
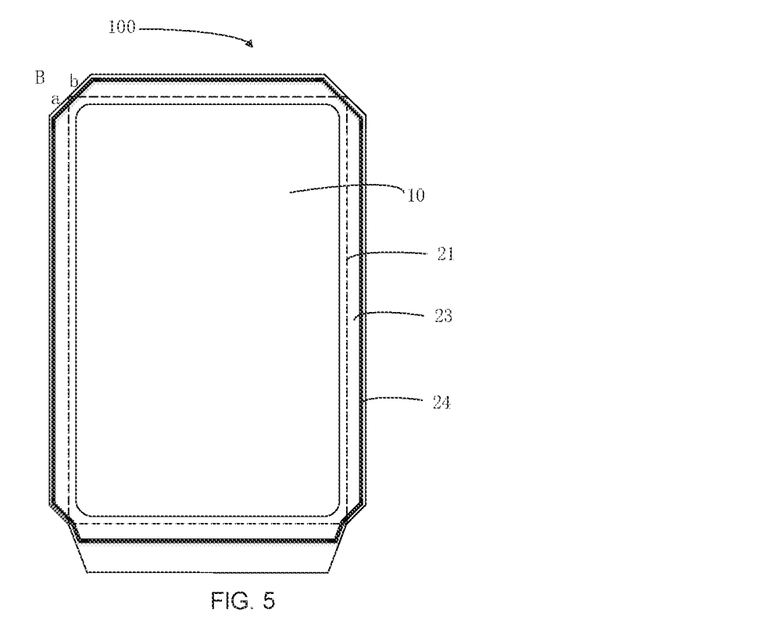
FIG. 5 is a structural schematic view of the second embodiment of the turning portion in the display panel in FIG. 1.

Please refer to FIG. 5, the difference between the above-mentioned embodiment is that an end of the first edge a and an end of the second edge b of the turning portion B are connected to form a bevel edge in the second embodiment of the turning portion of this embodiment, and the connection portion intersects a corner location of the fold frame 21.

Figure 6:
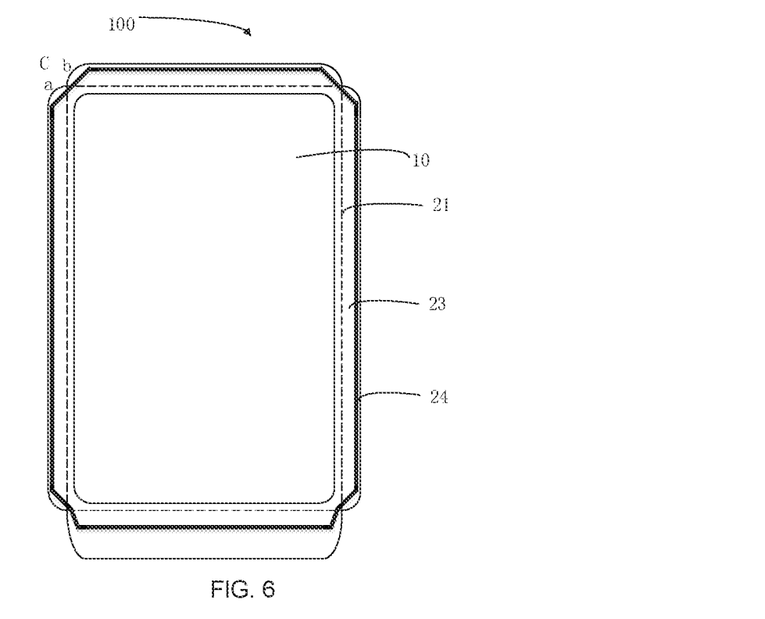
FIG. 6 is a structural schematic view of the third embodiment of the turning portion in the display panel in FIG. 1.

Please refer to FIG. 6, the difference between the above-mentioned embodiment is that the first edge a and the second edge b of the turning portion C are curve edges in the third embodiment of the turning portion of this embodiment, an end of the first edge a and an end of the second edge b are perpendicularly connected, at this time, the connection portion between the first edge a and the second edge b is the apex of the fold frame 21.

The arrangement of the first edge and the second edge are directly connected in the above-mentioned three embodiments of the turning portion avoids folding when the adjacent border is folded 180 degrees to the back side of the display panel 100, and reduces the thickness after the display panel 100 is folded. In combination with the non-orthogonal arrangement of the four corners of the display area 10 in this embodiment, the way of the first edge and the second edge directly connecting also could increase the distance between the boundary of the display area 10 and the boundary of the corner of the display panel 100, so the distance between the thin film encapsulation structure 24 and the boundary of the display area 10 is increased to increase the distribution area of the wiring of the circuit structure and prevent water and oxygen from entering the display area 10 to damage the display panel 100, the reliability of the display panel 100 is increased.

Figure 7:
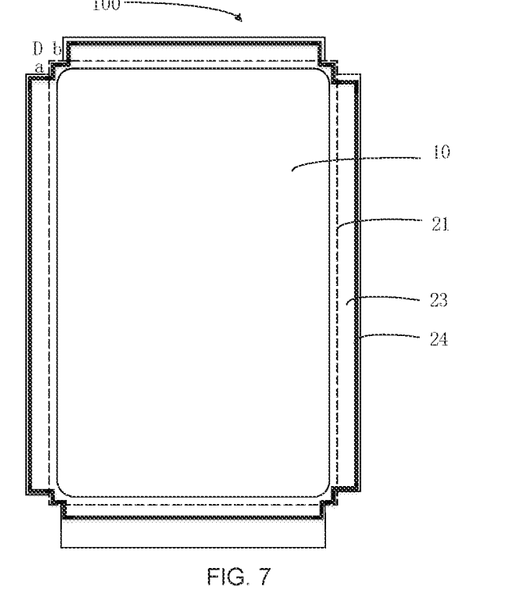
FIG. 7 is a structural schematic view of the fourth embodiment of the turning portion in the display panel in FIG. 1.
Figure 8:
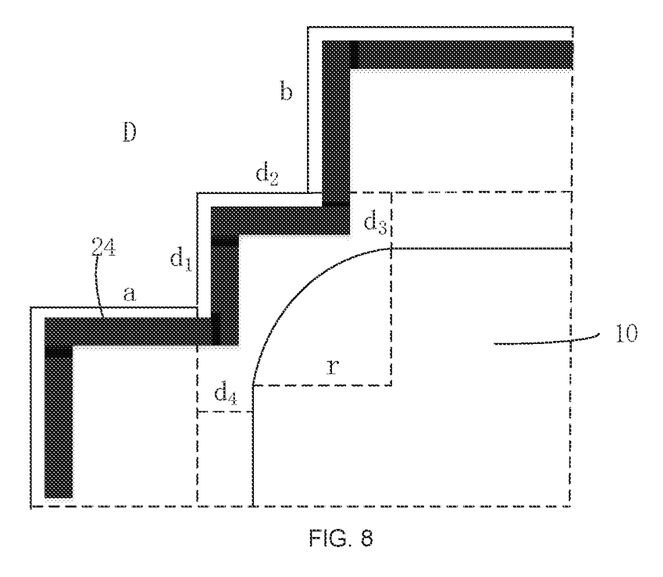
FIG. 8 is an enlarged schematic view of the turning portion in the display panel in FIG. 7.

Please refer to FIG. 7, the difference between the above-mentioned embodiment is that the first edge a and the second edge b of the turning portion D are connected via a connection edge in the fourth embodiment of the turning portion of this embodiment, the connection edge includes a first segment and a second segment perpendicularly arranged, the connection edge is the vertex of the fold frame 21, at this time, the vertex of the fold frame 21 is a right angle, the first edge a is connected to the second edge b via the vertex of the fold frame 21. An enlarged schematic view of the turning portion D in the display panel 100 in FIG. 7 as shown in FIG. 8, the distances between two adjacent borders and the display area 10 are d3 and d4, the lengths of the first segment and the second segment are d1 and d2, the radius of the round corner of the display area 10 is r. In this embodiment, in order to ensure that the wiring area of the circuit structure of the display panel 100 is not reduced and the reliability of the thin film encapsulation structure 24, d1, d2, d3 and d4 and the radius r of the round corner are required to satisfy d3−d1<r, d4−d2<r, but not limited. In addition, in this embodiment, the lengths of the first segment and the second segment in the connection edge of the four turning portions D in the second border area 23 are preferentially equal, but not limited.

Figure 9:
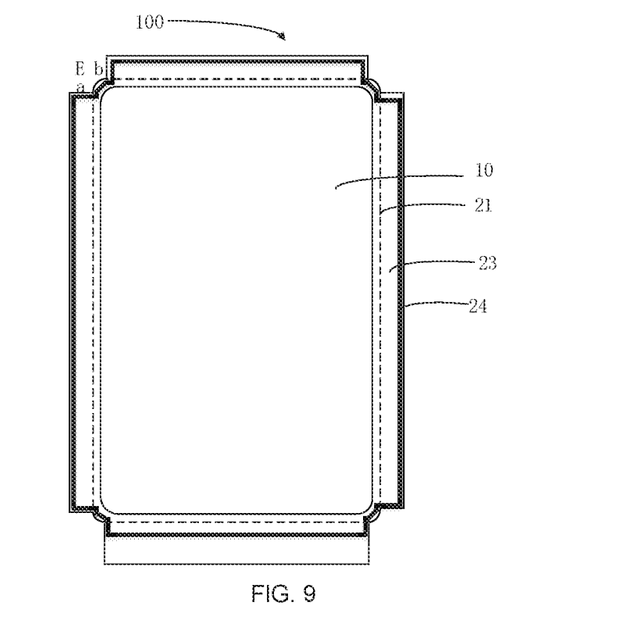
FIG. 9 is a structural schematic view of the fifth embodiment of the turning portion in the display panel in FIG. 1.

Please refer to FIG. 9, the difference between the above-mentioned embodiment is that a connection edge of the turning portion E is a curve edge in the fifth embodiment of the turning portion of this embodiment, the connection edge includes a first end and a second end, the connection edge is the vertex of the fold frame 21, at this time, the vertex of the fold frame 21 is a round angle, the first edge a is connected to the second edge b via the first end and the second end of the vertex of the fold frame 21.

In this embodiment, the connection edges of the four corners could be different types or sizes. The first edge and the second edge are connected via the connection edge such that the four borders of the second border area 23 are shrunk relative to the four fold lines of the fold frame 21, not only the bending stress of the four borders folded along the fold frame 21 could be reduced, but also the four borders could be accurately folded at the predetermined fold lines. In combination with the non-orthogonal arrangement of the four corners of the display area 10 in this embodiment, the way of the first edge and the second edge connecting further could increase the distance between the boundary of the display area 10 and the boundary of the corner of the display panel 100, so the distance between the thin film encapsulation structure 24 and the boundary of the display area 10 is increased to increase the distribution area of the wiring of the circuit structure and prevent water and oxygen from entering the display area 10 to damage the display panel 100, the reliability of the display panel 100 is increased.

Figure 10:
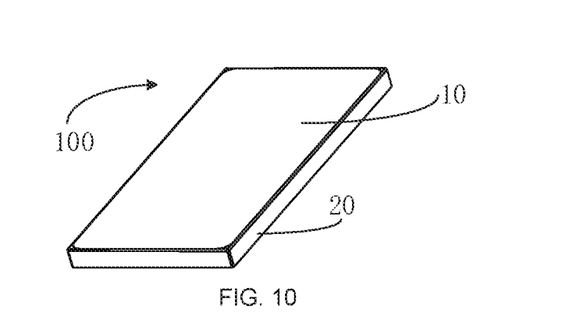
FIG. 10 is a schematic view of the four borders in the second border area in the display panel after folding 90 degrees in FIG. 1.

In this embodiment, the four borders of the second border area 23 including the turning portions could be independently folded along the fold frame 21 toward the back side of the display panel 100. As shown in FIG. 10, FIG. 10 is a schematic view of the four borders in the second border area 23 after folding 90 degrees along the fold frame 21 in this embodiment. The unique display area design can achieve ultra-narrow borders on the display panel to improve the proportion of the screen. Wherein the four borders of the second border area 23 may be respectively folded along the fold frame 21 to the back side of the display panel 100 at any angle to meet different requirements of the display panel 100, and are preferably folded 90 degrees or 180 degrees.

The display panel of the disclosure adopts a special display area design and a special border area wiring method to satisfy the wiring space of circuit structure, prevent water and oxygen from entering the display panel, and achieve the ultra-narrow border or even borderless border of the display panel, so the proportion of the screen could be increased.

The disclosure also provides a display device including the above-mentioned display panel. The display device may be a product or a component having a display function such as an active emissive display panel (OLED, Organic Light Emitting Diode), a cell phone, a tablet PC, a television, a display and so on.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A display area, wherein the display area includes four sides and four corners, and all of the four corners are not right angles; and
    a border area, surrounding the display area, wherein four fold lines respectively parallel to the four sides are arranged in the border area, the four fold lines enclose a fold frame, the fold frame divides the border area into a first border area and a second border area, the second border area includes four borders and a turning portion connecting every two of the four borders, and the turning portions makes the four borders be independently folded along the fold frame,
    wherein the four corners include round corners, elliptical corners, or chamfered corners, and
    wherein the turning portion includes a first edge and a second edge connecting to the first edge, and the first edge and the second edge are curve edges.

2. The display panel according to claim 1, wherein the first edge and the second edge are connected via a connection edge, the connection edge includes a first segment and a second segment perpendicularly arranged, the first edge and the second edge are connected via the first segment and the second segment.

3. The display panel according to claim 1, wherein the first edge and the second edge are connected via a connection edge, the connection edge is a curve edge including a first end and a second end, the first edge and the second edge are connected via the first end and the second end.

4. The display panel according to claim 1, wherein a distance between the fold frame and the display area ranges from 0.05 mm to 1 mm.

5. The display panel according to claim 1, wherein the four borders are folded along the fold frame in any angle.

6. A display device, comprising a display panel, wherein the display panel comprises:
- a display area, wherein the display area includes four sides and four corners, and all of the four corners are not right angles; and
- a border area, surrounding the display area, wherein four fold lines respectively parallel to the four sides are arranged in the border area, the four fold lines enclose a fold frame, the fold frame divides the border area into a first border area and a second border area, the second border area includes four borders and a turning portion connecting every two of the four borders, and the turning portions makes the four borders be independently folded along the fold frame,
- wherein the four corners include round corners, elliptical corners, or chamfered corners,
- wherein the turning portion includes a first edge and a second edge connecting to the first edge, and the first edge and the second edge are curve edges.

7. The display device according to claim 6, wherein the first edge and the second edge are connected via a connection edge, the connection edge includes a first segment and a second segment perpendicularly arranged, the first edge and the second edge are connected via the first segment and the second segment.

8. The display device according to claim 6, wherein a distance between the fold frame and the display area ranges from 0.05 mm to 1 mm.

9. The display device according to claim 6, wherein the four borders are folded along the fold frame in any angle.

10. A display panel, comprising
- A display area, wherein the display area includes four sides and four corners, and all of the four corners are not right angles; and
- a border area, surrounding the display area, wherein four fold lines respectively parallel to the four sides are arranged in the border area, the four fold lines enclose a fold frame, the fold frame divides the border area into a first border area and a second border area, the second border area includes four borders and a turning portion connecting every two of the four borders, and the turning portions makes the four borders be independently folded along the fold frame, wherein the four corners include round corners, elliptical corners, or chamfered corners, wherein the turning portion includes a first edge and a second edge connecting to the first edge, and the first edge and the second edge are straight edges, and wherein the first edge and the second edge are connected via a connection edge, the connection edge is a curve edge including a first end and a second end, the first edge and the second edge are connected via the first end and the second end.

* * * * *